March 18, 1969 YUICHI KANAME ET AL 3,433,982

PIEZOELECTRIC CERAMIC RESONATORS

Filed Dec. 19, 1966

United States Patent Office 3,433,982
Patented Mar. 18, 1969

3,433,982

PIEZOELECTRIC CERAMIC RESONATORS

Yuichi Kaname, Kaizuka-shi, Takashi Nagata, Ikeda-shi, Michio Ishibashi, Osaka, and Hiroshi Tsujimoto, Ibaragi-shi, Japan, assignors to Matsushita Electric Industrial Co., Ltd., Osaka, Japan, a corporation of Japan Continuation-in-part of application Ser. No. 300,306, Aug. 6, 1963. This application Dec. 19, 1966, Ser. No. 602,916
Claims priority, application Japan, Aug. 7, 1962, 37/34,174; Dec. 27, 1962, 37/59,290, 37/80,236
U.S. Cl. 310—8.2 4 Claims
Int. Cl. H04r 17/00, 17/10

ABSTRACT OF THE DISCLOSURE

A piezoelectric ceramic resonator of the thickness extension mode type formed from a pair of polarized piezoelectric ceramic elements in which, when an electric potential is applied between electrodes on the surface thereof, mechanical displacements will become in superposed relation for the fundamental mode of vibration and cancel the contour mode vibration and subharmonics thereof.

This invention relates to an improved piezoelectric ceramic resonator vibrating in the thickness-extension mode and more particularly to a piezoelectric ceramic filter element above the frequency of one megacycle per second, using a composite element of a pair of piezoelectric ceramic resonators sandwiched together in a single unit.

This application is a continuation-in-part application of Ser. No. 300,306, now abandoned, filed Aug. 6, 1963, by Yuichi Kaname, Takashi Nagata, Michio Ishibashi and Hiroshi Tsujimoto and assigned to the assignee of the present invention.

Various forms of a piezoelectric ceramic resonator have been proposed in respective stages of its development. Typical examples of the piezoelectric ceramic resonators as a ceramic filter element are such as; disc resonators vibrating in the radial mode as disclosed in a magazine entitled IRE Conv. Rec. Pt. 6, 1958, pp. 235 to 242; divided electrode disc resonators vibrating in the radial mode as disclosed in U.S. Patent No. 2,969,512; ring type resonators vibrating in the longitudinal mode as disclosed in a magazine entitled Proc. El. Comp. Conf. May 1959; and compound type disc resonator vibrating in the radial mode and/or the thickness mode as disclosed in U.S. Patent No. 3,174,122.

A piezoelectric ceramic resonator vibrating in the contour mode such as the radial mode shows an excellent frequency response near the frequency of a selected resonance frequency. One of difficulties of the contour mode resonator is to suppress the frequency responses of the harmonic overtones and/or the thickness-extension mode. Resonance responses of those harmonic vibrations cause spurious interferences to an electrical signal in a ceramic filter stage of the resonator. Therefore, they are called unwanted resonances of vibrations. The other practical difficulty of the resonator is that the contour dimensions become too small to practice in a frequency band above one megacycle per second. To overcome the difficulty, the overtones of the contour vibration have been practically applied. In case of the overtone resonator, an electro-mechanical efficiency decreases in comparison with those of the fundamental vibration and becomes a narrow band pass filter element naturally.

In such a high frequency band, a piezoelectric ceramic resonator vibrating in the thickness-extension mode has an advantage of the physical dimensions to practice. The reason is that the resonant frequency of the thickness-extension mode is primarily decided by only the thickness dimension of the piezoelectric ceramic resonator but not the contour dimension. As the wave length of the thickness-extension mode of vibration is shorter than the contour dimension of the resonator, the thickness-extension mode of vibration is apt to couple with the overtones of the contour vibrations. As a result, many sub-harmonic vibrations are piezoelectrically excited and become the unwanted resonances of the vibration.

In spite of the many efforts of the skilled engineers, the single tuned response resonator of the thickness-extension mode seems to be difficult to practice.

The general object of the present invention is to provide improved piezoelectric ceramic resonators overcoming at least one of the problems of the prior art as outlined above.

Another object of the present invention is to provide novel piezoelectric ceramic resonators characterized by single tuned response of the thickness-extension mode and complete suppression of the contour mode of the vibrations.

Further object of the present invention is to provide novel piezoelectric ceramic resonator applicable to an electrical wave filter element and an electrical single tuned resonant circuit element in a high frequency band.

For a better understanding of the present invention together with other and further objects thereof, reference is had to the following description taken in connection with the accompanying drawings, and its scope will be pointed out in the appended claims. In drawings:

It has been discovered according to the present invention that the aforesaid unwanted resonances of vibrations can be satisfactorily suppressed by employing a piezoelectric compound thickness resonator comprising a pair of the thin flat plates of polarized piezoelectric ceramic material, being bonded together directly and conductively at each planar surfaces in a face-to-face arrangement, first and second planar surfaces located opposedly to said bonding surface having first and second operating electrodes respectively thereon. The thickness dimension of the plate is adjusted so as to impart the resonator resonance vibration in the thickness-extension mode at a particularly selected frequency.

Figure 1:
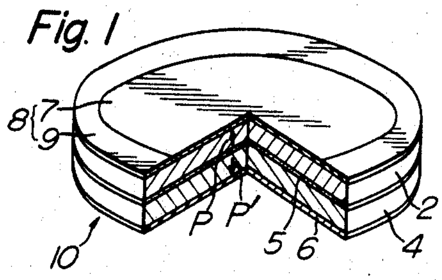
FIG. 1 is a perspective view, partly in section, of a piezoelectric ceramic resonator according to the present invention.

Referring now more particularly to FIG. 1, a piezoelectric ceramic resonator 10 comprises a pair of thin flat plates 2 and 4 of polarized piezoelectric ceramic materials. From the standpoint of ease of fabrication as well as excellence of performance, it is preferable that the plates 2 and 4 are in the form of a disc as shown in FIG. 1 and accordingly, it will be so described hereinafter. Other plane configurations including any polygon are also operable.

Said pair of flat plates can be made of any piezoelectric ceramics such as solid solutions of lead titanate and lead zirconate in certain mole ratios and their modifications combined with certain additives.

Referring once again to FIG. 1, each one of the major flat plane surfaces of the discs 2 and 4 are bonded together directly and conductively by an adhesive 5 in face-to-face arrangement. As the adhesive 5, for example, a satisfactory effect can be obtained with silver-epoxy formulations, sold under the trade name "Dotite" by Fuzikura Chemical Co. and/or "National Condyne" by Matushita Electric Ind. Co. On the entire first plane surface of the disc 4 located opposedly to the bonding surface is associated with first operating electrode 6 and on the second plane surface of the disc 2 located opposedly to the bonding surface is associated with second operating electrode 8 being composed of a main electrode 7 and an auxiliary electrode 9. Through the operating electrodes 6 and 8, electrical signal potentials are applied to the resonator. The polarization directions of the discs 2 and 4 in FIG. 1 are perpendicular to said plane surfaces (thickness direction) and reverse relation between discs 2 and 4 as shown by arrows P and P′ respectively. The electrodes can be composed of any suitable conductive materials in a conventional manner, such as silver-epoxy formulatons. For example, a satisfactory effect can be obtained with silver-epoxy formulations, sold under the trade names "Silver-6320" and "Silver-4929" by E. I. du Pont de Nemours & Co. for the electrodes 6, 7 and 9 respectively.

According to the present invention, the piezoelectric compound ceramic resonator 10 vibrates in the odd numbered thickness-extension mode.

The primary principle of the operation of the resonator 10 will now be described first assuming that an electric signal potential which has a frequency corresponding to the frequency of the odd numbered thickness-extension mode of vibrations of the resonator is applied through the electrodes 6 and 8. It is also assumed that the electric signal potential field coincides to the polarization direction of the disc 2 at a certain moment. At this moment, the disc 2 is extended in the thickness direction according to the piezoelectric constant $d_{33}$ whereas the disc 4 is contracted because it is polarized in the direction opposite to the signal potential field. Hereinunder the piezoelectric effects fo the piezoelectric ceramic body are explained according to the definitions of the IRE Standards on Piezoelectric Crystals as disclosed in Proc. IRE, vol. 46, pp. 764 to 778; April 1958. Similarly, with the signal potential field reversed, the disc 2 is contracted while the disc 4 thereof is extended. As is observed, the bonding plane 5 lying midway of the thickness of the resonator is subjected to displacement in the same direction, that is a superposed relation, by deformation of the both discs 2 and 4 of the resonator with a result that at such frequency the resonance system is fully electrically excited due to the piezoelectric effect of the ceramics used.

In the case where an electric signal potential field having a frequency corresponding to the frequency of the even numbered thickness-extension mode of vibrations is applied through the electrodes 6 and 8 thereof, the bonding plane 5 is subjected to displacement in the opposite directions, that is a cancel relation, by deformation of the disc 2 and the disc 4 of the resonator and hence its vibration is suppressed. At such frequency, therefore, the resonance system cannot be electrically excited through the piezoelectric effect of the ceramics used.

Now it is assumed that an electric signal potential field having the frequency corresponding to the frequency of the radial mode of vibrations of the resonator is applied thereto through the electrodes 6 and 8. In this case, also, the displacement of the bonding plane 5 is limited and any vibration is precluded since the discs 2 and 4 of the resonators are subjected to deformation at all times in opposite directions. Thus, at such frequency, the resonance system cannot be electrically excited through the piezoelectric effect.

To summerize the operation of the present compound resonator, the resonator 10 has pronounced characteristics that the resonator 10 can be only excited piezoelectrically at the odd numbered thickness-extension mode of the vibrations but cannot be excited with any of the inherent vibrations.

To practice the principle mentioned above, it is apparent that the discs 2 and 4 including their electrodes have to be kept mechanically and electrically in a precise symmetrical relation. In addition, each disc plate has to be adjusted precisely to same dimension naturally. Actually, however, conventional piezoelectric ceramic bodies have irregularities, for instance, in porosities and frequency constants. And also to control the thickness of the electrode is practically diffiecult. These irregularities are apt to cause the sub-harmonic vibration near the frequency of the selected thickness-extension mode of vibration.

According to the present invention, the auxiliary electrode 9 is discovered for correcting unavoidable irregularities mentioned above as far as the frequency responses are concerned. The auxiliary electrode 9 is the outer part of the electrode 8 and is conductively associated with the main electrode 7 as shown in FIG. 1. Actually adjusting the surface area of the auxiliary electrode 9, the unwanted resonance responses caused by the irregularities can be suppressed entirely satisfactorily.

Figure 2:
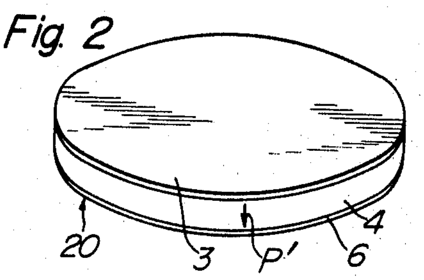
FIG. 2 is a perspective view of an elementary piezoelectric ceramic disc resonator comprising a part of the present invention.

Referring now to FIG. 2, wherein similar reference characters designate parts similar to those of FIG. 1 and reference character 20 designates the single piezoelectric resonator element of the compound resonator of FIG. 1 in accordance with the present invention. The resonator element 20 has an operating electrode 3 instead of bonding surface 5 of FIG. 1. The polarization direction is perpendicular to the flat plane surfaces (thickness direction) as shown by the arrow P′.

Figure 3:
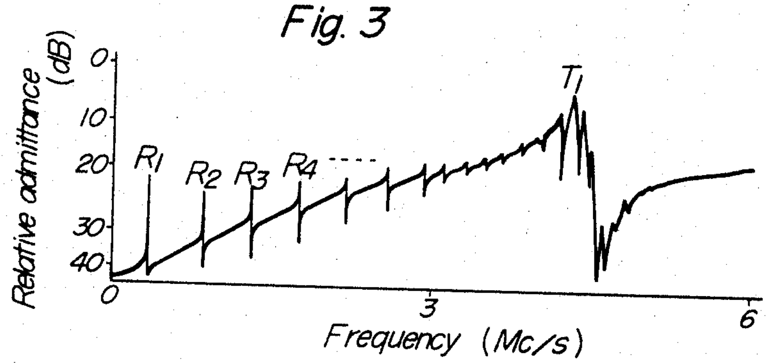
FIG. 3 is a graphical representation of the response curve of the elementary disc resonator shown in FIG. 2.
Figure 4:
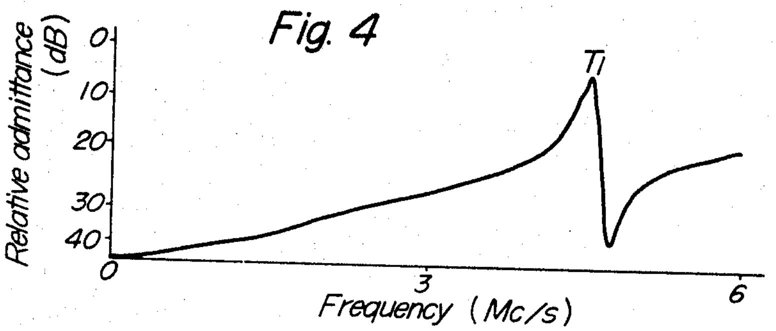
FIG. 4 is a graphical representation of the response curve of the piezoelectric compound resonator of the present invention.
Figure 5:
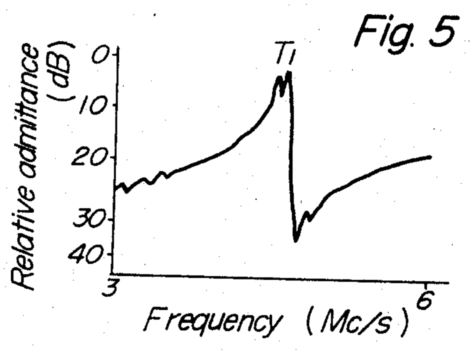
FIG. 5 is a graphical representation of the response curve of the piezoelectric compound resonator without adjusting the auxiliary electrode.

Reference is now made to FIGS. 3, 4 and 5 for illustrating piezoelectric response curves of resonators measured by a transmission circuit method as disclosed in Proc. IRE, vol. 45, pp. 353 to 358, March 1957.

FIG. 3 shows a piezoelectric response curve of the single disc resonator as shown in FIG. 2. The measurements were carried out in the frequency range from zero to 6 megacycles per second, including the fundamental resonance frequency of the thickness-extension mode. In FIG. 3 the notations of $R_1$, $R_2$, $R_3$ . . . are the responses of the fundamental radial vibration and its overtones respectively, and $T_1$ is the response of the fundamental thickness-extension vibration.

FIG. 4 shows a piezoelectric response curve of the compound disc resonator of the present invention as shown in FIG. 1. FIG. 5 shows a piezoelectric response curve of the compound disc resonator of the present invention but not adjusted for the auxiliary electrode. In FIGS. 4 and 5 the notation $T_1$ is the similar thickness extension mode as shown in FIG. 3.

The single element dimensions of the piezoelectric ceramic disc resonators for producing the curves shown in FIGS. 3, 4 and 5 were about 7.2 mm. in diameter and 0.4 mm. in thickness. Therefore, the difference between the piezoelectric response curves in FIGS. 3 and 4 is mainly whether the single disc structure or the compound disc structure is employed. It will be seen in FIG. 3 large responses of the radial mode and its overtones in the frequency range below the resonance frequency of the fundamental thickness-extension mode and many ripples near the frequency of the thickness-extension mode. Comparing the piezoelectric response curves in FIG. 3 with those in FIG. 4, it is apparent that the compound resonator structure serves to suppress completely the unwanted resonances of vibrations in the wide frequency range without adversely affecting to the thickness-extension mode response as mentioned above.

It will be seen still small ripples in FIG. 5 near the frequencies of corresponding the radial mode and the thickness-extension mode. These ripples seem to be excited with the reason of the unavoidable asymmetry of the compound structure mentioned above. But actually these small ripples can be suppressed completely, adjusting the surface area of the auxiliary electrode 9 of FIG. 1 and it is possible to improve the frequency responses as shown in FIG. 4.

A suitable relation between the main electrode 7 and the auxiliary electrode 9 is that the main electrode 7 is disposed on the second major surface at a central area in the surface range of 70 percent of the second major surface and the auxiliary electrode 9 is disposed partially around the main electrode on the remaining area of the second major surface conductively connected to the main electrode. The main electrode area less 70 percent of the second major surface area will cause a suppression of the selected thickness-extension mode response. In the operation principle, the main electrode and the auxiliary electrode may be formed with same electrode materials. Actually, the auxiliary electrode is required to adjust after the compound resonator is constructed. Therefore, the electrode material is better chosen from conductive materials characterized by paintable and removable below a temperature of the Curie point of the piezoelectric ceramic body, such as "Silver-4929" mentioned above.

The bonding structure is also important for a satisfactory configuration of the face-to-face arrangement of the present invention. The pair of the piezoelectric disc elements has to be bonded with a conductive adhesive directly and conductively. Further for a complete suppression of the reflection of elastic waves between the piezoelectric ceramic surfaces and the adhesive layer, a mechanical quality factor Q of the adhesive should be less than those of the piezoelectric ceramic body.

Another important aspect of the configuration of the compound resonator of the present invention is the thickness dimension of the piezoelectric ceramic disc element. For a satisfactory operation the thickness should be less than 1 mm.

Where the thickness is above 1 mm., the irregularity of the piezoelectric ceramic body cannot compensate with the electrode adjustment and the mechanical symmetry assembly of the bonding structure. As a result, unwanted resonance responses cannot be suppressed completely.

The compound piezoelectric ceramic resonator explained hereinabove can be prepared by the following steps. A piezoelectric ceramic body is formed by well-known ceramic techniques into a shape of the single disc plate. To get precise dimensions, it is necessary to lap the formed ceramic body by a conventional lapping tool. A conductive material characterized by a chemically strong resistance and a strong adhesion such as "Silver-6320" is applied on the flat plane surfaces of a pair of the ceramic discs so as to correspond to the first electrode on the entire surface of the first major surface and the main electrode of the second major surface of FIG. 1. And then a conductive material characterized by a chemically weak resistance such as "Silver-4929" is applied to the remaining entire flat plane surfaces of the pair of the ceramic discs. The pair of the ceramic discs having the electrodes are then polarized by D.C. high voltage applied between the electrodes in a conventional way. The polarized discs then are immersed in a solvent such as toluene and the chemically weak electrode is removed under the temperature of the Curie point of the piezoelectric ceramic body. Thereafter, the pair of the discs are conductively bonded together at the entire removed surfaces into a face-to-face arrangement below the temperature of the Curie point of the ceramics. In the bonding processes the polarization relation of the pair of ceramic discs has to be kept in an opposite relation for the face-to-face arrangement. And finally a conductive material such as "Silver-4929" is applied partially on the remaining space on the second major surfaces adjusting so that small responses of the unwanted resonances are completely suppressed.

While there have been described what are at present considered to be the preferred embodiments of this invention, it will be obvious to those skilled in the art that various changes and modifications can be made therein without departing from the invention as set forth in the appended claims.

What is claimed is:

1. A piezoelectric ceramic resonator of the thickness-extension mode comprising, a pair of thin flat plates of a polarized piezoelectric ceramic material having identical and parallel major plane surfaces, an adhesive material bonding directly and conductively each of said major surfaces in a face-to-face arrangement, first and second electrode means, first and second major surfaces opposedly located with respect to the adhesive layer being conductively associated with said first and second electrode means, said first electrode being conductively associated on the entire surface of said first major surface, said second electrode comprising a main electrode and an auxiliary electrode, said main electrode being disposed at a central area of said second major surface in the surface range of 70 percent of said major surface area, said auxiliary electrode being disposed partially around said main electrode on the remaining area of said major surface and being conductively connected to said main electrode; mechanical displacements on said adhesive layer, when an electrical signal potential is applied between said first and second electrodes, becoming superpose relation for the fundamental thickness-extension mode of vibration and cancel relation for the contour mode of vibrations and the subharmonics, so that the piezoelectric response is predominant in said fundamental thickness-extension mode of vibration and its odd-numbered overtones and negligible for said contour mode of vibrations and sub-harmonics at least near the frequency of said fundamental thickness-extension mode and its overtones, the thickness dimension of said plate being determined to impart thereto said fundamental thickness-extension mode in a particularly selected frequency and the polarizations of said pair of plates being perpendicular to said major surfaces and opposite to a direction at a boundary of said adhesive layer respectively.

2. A piezoelectric ceramic resonator as claimed in claim 1, wherein said thin flat plates are disc plates having the thickness less than 1 mm.

3. A piezoelectric ceramic resonator as claimed in claim 1, wherein said adhesive material has a mechanical quality factor lower than the mechanical quality factor of said piezoelectric ceramic material.

4. A piezoelectric ceramic resonator as claimed in claim 1, wherein said second electrode is a silver-epoxy formulation and solutionable in a solvent below the temperature of the Curie point of said ceramic material.

References Cited

UNITED STATES PATENTS

| | | | |
|---|---|---|---|
| 3,252,017 | 5/1966 | Bartels | 310—9.8 |
| 3,307,052 | 2/1967 | Neilson | 310—8.5 |
| 3,374,367 | 3/1968 | Cowan | 310—8.5 |
| 3,382,381 | 5/1968 | Horton | 310—8.2 |
| 3,396,287 | 8/1968 | Horton | 310—9.7 |

J. D. MILLER, *Primary Examiner.*

U.S. Cl. X.R.

310—8.3, 8.5, 9.5, 9.7, 9.8